(12) United States Patent
Ohnuma et al.

(10) Patent No.: US 8,119,490 B2
(45) Date of Patent: Feb. 21, 2012

(54) METHOD FOR MANUFACTURING SOI SUBSTRATE

(75) Inventors: Hideto Ohnuma, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 171 days.

(21) Appl. No.: 12/352,176

(22) Filed: Jan. 12, 2009

(65) Prior Publication Data

US 2009/0203191 A1    Aug. 13, 2009

(30) Foreign Application Priority Data

Feb. 4, 2008    (JP) ................................. 2008-024520

(51) Int. Cl.
*H01L 21/331*    (2006.01)
(52) U.S. Cl. .................. 438/311; 438/458; 257/E21.568
(58) Field of Classification Search .................. 438/455, 438/458, 311; 257/E21.568, E21.57
See application file for complete search history.

(56) References Cited

U.S. PATENT DOCUMENTS

| | | | | |
|---|---|---|---|---|
| 5,362,667 A | * | 11/1994 | Linn et al. ..................... | 438/455 |
| 6,372,609 B1 | * | 4/2002 | Aga et al. ..................... | 438/459 |
| 6,534,380 B1 | * | 3/2003 | Yamauchi et al. ............ | 438/455 |
| 6,737,337 B1 | * | 5/2004 | Chan et al. .................... | 438/455 |
| 6,984,570 B2 | * | 1/2006 | Wang ............................. | 438/455 |
| 7,119,365 B2 | | 10/2006 | Takafuji et al. | |
| 2004/0235266 A1 | | 11/2004 | Tong | |
| 2006/0273068 A1 | * | 12/2006 | Maunand Tussot et al. .... | 216/33 |
| 2007/0063281 A1 | | 3/2007 | Takafuji et al. | |

FOREIGN PATENT DOCUMENTS

| | | |
|---|---|---|
| EP | 1 045 448 | 10/2000 |
| JP | 02-054532 | 2/1990 |
| JP | 02-054532 A | 2/1990 |
| JP | 2000-124092 | 4/2000 |
| JP | 2004-087606 | 3/2004 |
| JP | 2007-515779 | 6/2007 |

* cited by examiner

*Primary Examiner* — Khiem D Nguyen
(74) *Attorney, Agent, or Firm* — Eric J. Robinson; Robinson Intellectual Property Law Office, P.C.

(57) ABSTRACT

A semiconductor substrate and a base substrate made from an insulator are prepared; an oxide film containing a chlorine atom is formed over the semiconductor substrate; the semiconductor substrate is irradiated with accelerated ions through the oxide film to form an embrittled region at a predetermined depth from a surface of the semiconductor substrate; plasma treatment of the oxide film is performed by applying a bias voltage; a surface of the semiconductor substrate and a surface of the base substrate are disposed opposite to each other to bond a surface of the oxide film and the surface of the base substrate to each other; and heat treatment is performed to cause separation along the embrittled region after bonding the surface of the oxide film and the surface of the base substrate to each other, thereby forming a semiconductor film over the base substrate with the oxide film interposed therebetween.

20 Claims, 12 Drawing Sheets

(A-1)

(A-2)

(A-3)

(A-4)

METHOD FOR MANUFACTURING SOI SUBSTRATE

BACKGROUND OF THE INVENTION

1. Field of the Invention

The present invention relates to a method for manufacturing a silicon-on-insulator (SOI) substrate and a method for manufacturing a semiconductor device.

2. Description of the Related Art

In recent years, integrated circuits have been developed which use a silicon-on-insulator (SOI) substrate in which a thin single crystal semiconductor film is present over an insulating surface, instead of a bulk silicon wafer. The use of an SOI substrate can reduce parasitic capacitance between a drain of a transistor and a substrate; thus, SOI substrates are attracting attention for their ability to improve performance of semiconductor integrated circuits.

One of known methods for manufacturing SOI substrates is a hydrogen ion implantation separation method (for example, see Reference 1: Japanese Published Patent Application No. 2000-124092). A summary of a method for manufacturing an SOI substrate by a hydrogen ion implantation separation method is as follows. First, hydrogen ions are implanted into a silicon wafer by an ion implantation method to form a microbubble layer at a predetermined depth from the surface. Next, the silicon wafer into which hydrogen ions have been implanted is bonded to another silicon wafer with a silicon oxide film interposed therebetween. Then, by heat treatment, the microbubble layer serves as a cleavage plane and a part of the silicon wafer into which hydrogen ions have been implanted is separated in a thin film shape along the microbubble layer. Accordingly, a single crystal silicon film can be formed over the other bonded silicon wafer.

A method for forming a single crystal silicon layer over a base substrate made from glass by using such a hydrogen ion implantation method as described above has been proposed (for example, see Reference 2: Japanese Published Patent Application No. 2004-87606). Glass substrates can be manufactured in larger sizes and are less expensive than silicon wafers. Thus, the use of a glass substrate as a base substrate makes it possible to manufacture a large-sized inexpensive SOI substrate.

SUMMARY OF THE INVENTION

In order to strongly bond a semiconductor substrate and a base substrate to each other, a large number of covalent bonds need to be formed through heat treatment at high temperature. However, when a substrate having low heat resistance, such as a glass substrate, is used as a base substrate, temperature for heat treatment is more limited (which means that heat treatment needs to be performed through a low-temperature process) than when a silicon substrate is used as a base substrate. Thus, the bonding strength between a semiconductor substrate and a base substrate may be insufficient. If the bonding strength is not sufficient, a semiconductor film provided over a base substrate may peel off.

In view of the aforementioned problem, it is an object of the present invention to sufficiently increase bonding strength between a semiconductor substrate and a base substrate even when the semiconductor substrate and the base substrate are bonded at low temperature.

A semiconductor substrate and a base substrate made from an insulator are bonded to each other with an oxide film containing chlorine atoms interposed therebetween. In this case, even when bonding is conducted at low temperature, the bonding strength between the semiconductor substrate and the base substrate can be increased.

An aspect of the invention disclosed herein is: to form an oxide film containing a chlorine atom over a single crystal semiconductor substrate; to irradiate the single crystal semiconductor substrate with accelerated ions through the oxide film to form an embrittled region in a region at a predetermined depth from a surface of the single crystal semiconductor substrate; to perform plasma treatment of the oxide film over the single crystal semiconductor substrate by applying a bias voltage; to dispose the single crystal semiconductor substrate and a base substrate made from an insulator opposite to each other to bond a surface of the oxide film and a surface of the base substrate to each other; and to perform heat treatment to cause separation along the embrittled region after bonding the surface of the oxide film and the surface of the base substrate to each other, thereby forming a single crystal semiconductor film over the base substrate with the oxide film interposed therebetween.

Another aspect of the invention disclosed herein is: to form a first oxide film containing a chlorine atom over a single crystal semiconductor substrate; to form a second oxide film containing a chlorine atom over a base substrate made from an insulator; to irradiate the single crystal semiconductor substrate with accelerated ions through the first oxide film to form an embrittled region in a region at a predetermined depth from a surface of the single crystal semiconductor substrate; to perform plasma treatment of the first oxide film over the single crystal semiconductor substrate by applying a bias voltage; to dispose the single crystal semiconductor substrate and the base substrate opposite to each other to bond a surface of the first oxide film and a surface of the second oxide film to each other; and to perform heat treatment to cause separation along the embrittled region after bonding the surface of the first oxide film and the surface of the second oxide film to each other, thereby forming a single crystal semiconductor film over the base substrate with the second oxide film and the first oxide film interposed therebetween.

The term "single crystal" in this specification refers to a crystal in which crystal faces and crystal axes are uniform and constituent atoms of which are in a spatially ordered arrangement. Although a single crystal is constituted by an ordered arrangement of atoms, it may also include a lattice defect in which the arrangement is partially disordered or include an intended or unintended lattice distortion.

The term "semiconductor device" in this specification refers to devices in general that can operate by utilizing semiconductor characteristics, and an electro-optical device, a semiconductor circuit, and an electronic device are all included in the semiconductor device.

The term "display device" in this specification includes a light emitting device and a liquid crystal display device. A light emitting device includes a light emitting element, and a liquid crystal display device includes a liquid crystal element. A light emitting element includes, in its scope, an element whose luminance is controlled by current or voltage, and specifically includes an inorganic electroluminescent (EL) element, an organic EL element, and the like.

By bonding between a semiconductor substrate and a base substrate made from an insulator with an oxide film containing chlorine atoms interposed therebetween, the bonding strength between the semiconductor substrate and the base substrate can be sufficiently increased even when the semiconductor substrate and the base substrate are bonded at low temperature.

BRIEF DESCRIPTION OF THE DRAWINGS

FIGS. 1A-1 to 1A-4, 1B, 1C, and 1D are diagrams illustrating an example of a method for manufacturing an SOI substrate.

FIGS. 3A-1 to 3A-4, 3B-1 to 3B-4, 3C, and 3D are diagrams illustrating an example of a method for manufacturing an SOI substrate.

DETAILED DESCRIPTION OF THE INVENTION

Figure 1A:
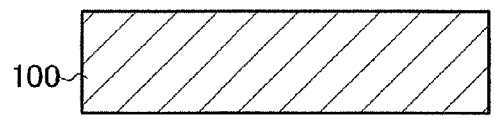
Figure 1A:
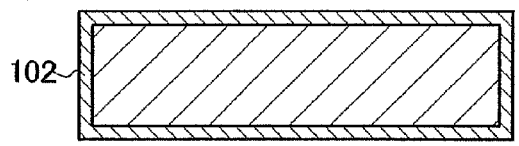
Figure 1A:
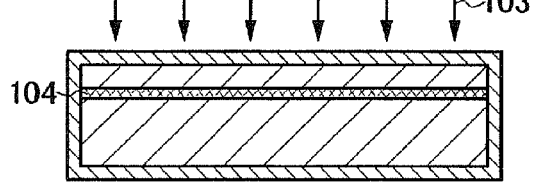
Figure 1A:
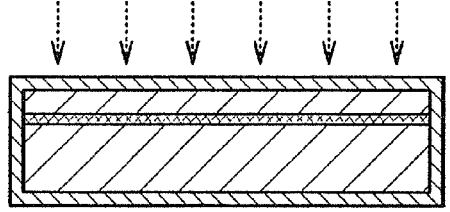

Embodiment modes and embodiments are described in detail with reference to the drawings. Note that the present invention is not limited to the description in the following embodiment modes and embodiments, and it would be obvious to those skilled in the art that modes and details can be changed in various ways without departing from the spirit of the invention. In addition, structures in different embodiment modes can be appropriately combined. In structures of the invention hereinafter described, the same reference numerals are commonly given to like components or components having like functions, and the components will not be described repeatedly.

Embodiment Mode 1

In this embodiment mode, a method for manufacturing an SOI substrate by bonding a semiconductor substrate and a base substrate is described with reference to drawings.

First, a semiconductor substrate 100 is prepared (see FIG. 1A-1).

As the semiconductor substrate 100, a single crystal semiconductor substrate or a polycrystalline semiconductor substrate can be used, and examples thereof include single crystal and polycrystalline silicon substrates, single crystal and polycrystalline germanium substrates, compound semiconductor substrates of gallium arsenide, indium phosphide, and the like. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape is not limited to a circular shape, and a silicon substrate processed into a rectangular shape or the like can also be used. A case in which a single crystal silicon substrate is used as the semiconductor substrate 100 is hereinafter described.

Note that it is preferable that a surface of the semiconductor substrate 100 be appropriately cleaned in advance with a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like.

Next, the semiconductor substrate 100 is subjected to thermal oxidation treatment to form an oxide film 102 (here, a silicon oxide ($SiO_x$) film) (see FIG. 1A-2). The thermal oxidation treatment is performed in an oxidizing atmosphere to which a halogen is added.

In this embodiment mode, the semiconductor substrate 100 is subjected to thermal oxidation treatment in an oxidizing atmosphere into which a chlorine (Cl) gas is introduced, thereby forming the oxide film 102 which is oxidized with chlorine. Thus, the oxide film 102 contains chlorine atoms.

The chlorine atoms contained in the oxide film 102 form distortions, break Si—O bonds, and form microvoids in the film, thereby lowering the density of the oxide film 102. As a result, absorption of moisture into the oxide film 102 is improved and diffusion rate is increased. That is, when moisture is present on a surface of the oxide film 102, the moisture present on the surface of the oxide film 102 can be rapidly absorbed and diffused into the oxide film 102.

As halogen atoms contained in the oxide film 102, chlorine atoms are preferable. This is because the inclusion of chlorine atoms makes it possible to reduce interface states and improve the quality of an oxide film. The oxide film 102 may contain fluorine atoms as well as chlorine atoms. A surface of the semiconductor substrate 100 can be oxidized with fluorine by thermal oxidation treatment in an oxidizing atmosphere after immersion of the surface of the semiconductor substrate 100 into an HF solution or by thermal oxidation treatment in an oxidizing atmosphere to which HF is added.

As an example of thermal oxidation treatment, thermal oxidation (hydrogen chloride (HCl) oxidation) may be performed in an oxidizing atmosphere which contains HCl at a proportion of 0.5 vol. % to 10 vol. % (preferably, 2 vol. %) with respect to oxygen at a temperature of 900° C. to 1150° C. (typically, 1000° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm. By thermal oxidation treatment at a temperature of 900° C. to 1150° C. in the manner described above, impurities such as oxygen contained in the semiconductor substrate 100 in the vicinity of the interface with the oxide film 102 can be reduced.

As another example of thermal oxidation treatment, thermal oxidation may be performed in an oxidizing atmosphere which contains trans-1,2-dichloroethylene (DCE) at a proportion of 0.25 vol. % to 5 vol. % (preferably, 3 vol. %) with respect to oxygen at a temperature of 700° C. to 1150° C. (typically, 950° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm. Trans-1,2-dichloroethylene is thermally decomposed at low temperature, which is effective when low-temperature thermal oxidation treatment is needed. Note that, instead of trans-1,2-dichloroethylene, cis-1,2-dichloroethylene, 1,1-dichloroethylene, or a mixed gas of two or more of these gases may be used.

In this embodiment mode, the concentration of chlorine atoms in the oxide film 102 is controlled to $1\times10^{17}/cm^3$ to $1\times10^{21}/cm^3$. In addition, a large number of chlorine atoms are made contained in the oxide film 102 at the interface with the semiconductor substrate 100 (the concentration is made to peak in the vicinity of the interface with the semiconductor substrate 100). When a large number of chlorine atoms are included in the vicinity of the interface in this manner, interface states can be reduced.

The inclusion of chlorine atoms in the oxide film 102 is also effective in preventing contamination of a semiconductor substrate by trapping heavy metal that is an extrinsic impurity. Examples of such heavy metal are Fe, Cr, Ni, Mo, and the like, which are introduced into a semiconductor substrate when an embrittled region is formed by doping with ions which are not subjected to mass separation. That is, the oxide film 102 containing a halogen by HCl oxidation or the like serves to getter an impurity, such as heavy metal, which adversely affects a semiconductor substrate. By heat treatment which is performed after the oxide film 102 is formed, impurity metal contained in the semiconductor substrate is separated out to the oxide film 102 and captured by reacting with the halogen (e.g., chlorine). Accordingly, the impurity captured in the oxide film 102 can be fixed and prevented from contaminating the semiconductor substrate 100. When bonded to a glass substrate, the oxide film 102 can also function as a blocking film against an impurity, such as Na, contained in glass.

The inclusion of hydrogen in a gas used for thermal oxidation treatment serves to repair defects at the interface between the semiconductor substrate 100 and the oxide film 102 and reduce localized state density at the interface. Thus, the oxide film 102 is preferably made to contain hydrogen atoms at $1 \times 10^{18}/cm^3$ or more.

In this embodiment mode, the case is described in which the oxide film 102 containing chlorine atoms is formed by thermal oxidation treatment in an oxidizing atmosphere containing hydrogen chloride or dichloroethylene. However, the present invention is not limited to this example. For example, an oxide film 112 (e.g., $SiO_x$) may be formed over a surface of the semiconductor substrate 100 by thermal oxidation treatment in an oxidizing atmosphere (see FIGS. 2A and 2B), and then, the oxide film 112 may be made to contain chlorine atoms by addition of chlorine ions, which are accelerated by an electric field, with the use of an ion doping apparatus or an ion implantation apparatus (see FIG. 2C). Furthermore, thermal oxidation treatment may be performed in an oxidizing atmosphere after surface treatment with an aqueous solution of hydrogen chloride (hydrochloric acid).

Next, the semiconductor substrate 100 is irradiated with ions having kinetic energy to form an embrittled region 104 having a damaged crystal structure at a predetermined depth in the semiconductor substrate 100 (see FIG. 1A-3). As illustrated in FIG. 1A-3, by irradiation of the semiconductor substrate 100 with accelerated ions 103 through the oxide film 102, the ions 103 are introduced to a region at a predetermined depth from a surface of the semiconductor substrate 100, whereby the embrittled region 104 can be formed. The ions 103 are obtained as follows: a source gas is excited to generate plasma of the source gas, and ions included in this plasma are extracted from the plasma by the action of an electric field and are then accelerated.

The depth of a region where the embrittled region 104 is formed can be adjusted by kinetic energy, mass, and incident angle of the ions 103. Kinetic energy can be adjusted by acceleration voltage, dose, or the like. The embrittled region 104 is formed at a depth equal to or substantially equal to the average penetration depth of the ions 103. Thus, the thickness of a semiconductor layer separated from the semiconductor substrate 100 is determined by the depth to which the ions 103 are added. The depth at which the embrittled region 104 is formed is adjusted such that the thickness of this semiconductor layer is 110 nm to 500 nm, preferably, 50 nm to 200 nm.

The embrittled region 104 can be formed by ion doping treatment. Ion doping treatment can be performed using an ion doping apparatus. A typical ion doping apparatus is a non-mass-separation apparatus with which an object placed in a chamber is irradiated with all ion species generated by excitation of a process gas into plasma. The apparatus is called a non-mass-separation apparatus because an object is irradiated with all ions species in plasma without mass separation. In contrast, an ion implantation apparatus is a mass-separation apparatus. An ion implantation apparatus is an apparatus with which an object is irradiated with an ion species having a specific mass after mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ion species, an electrode for exciting a source gas to generate plasma, and the like. As the electrode for generating plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to the components described above and an as-needed mechanism may be provided.

In this embodiment mode, hydrogen is added to the semiconductor substrate 100 with an ion doping apparatus. A hydrogen-containing gas is supplied as a plasma source gas. For example, $H_2$ is supplied. A hydrogen gas is excited to generate plasma; ions included in plasma are accelerated without mass separation; and the semiconductor substrate 100 is irradiated with the accelerated ions.

In an ion doping apparatus, the percentage of $H_3^+$ to the total amount of ion species ($H^+$, $H_2^+$, and $H_3^+$) that are generated from a hydrogen gas is set to 50% or higher. Preferably, the percentage of $H_3^+$ is set to 80% or higher. Because an ion doping apparatus does not involve mass separation, the percentage of one kind to plural kinds of ion species that are generated in plasma is preferably 50% or higher, more preferably, 80% or higher. By irradiation with ions having the same mass, ions can be added in a concentrated manner to the same depth in the semiconductor substrate 100.

In order to form the embrittled region 104 in a shallow region, the acceleration voltage for the ions 103 needs to be low. With an increase in the percentage of $H_3^+$ ions in plasma, atomic hydrogen (H) can be efficiently added to the semiconductor substrate 100. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the cycle time for ion irradiation treatment can be shortened and productivity and throughput can be improved.

The step of irradiating the semiconductor substrate 100 with the accelerated ions 103 can also be performed with an ion implantation apparatus. An ion implantation apparatus is a mass-separation apparatus with which an object placed in a chamber is irradiated with an ion species having a specific mass after mass separation of plural kinds of ion species generated by excitation of a source gas into plasma. Thus, in the case of using an ion implantation apparatus, H$^+$ ions and H$_2^+$ ions that are generated by excitation of a hydrogen gas are subjected to mass separation, and either H$^+$ ions or H$_2^+$ ions are accelerated, with which the semiconductor substrate 100 is irradiated.

Next, a surface of the oxide film 102 formed over the semiconductor substrate 100 is preferably subjected to plasma treatment (see FIG. 1A-4).

Plasma treatment of a surface to be treated is performed by introducing an inert gas (such as an argon (Ar) gas) and/or a reactive gas (such as an oxygen (O$_2$) gas or a nitrogen (N$_2$) gas) into a chamber in a vacuum state and applying a high-frequency voltage between an electrode over which a substrate is placed and a counter electrode (creating a state in which a bias voltage is applied).

For example, oxygen plasma treatment of the oxide film 102 is performed by introducing an oxygen gas into a chamber in a vacuum state and applying a high-frequency voltage between an electrode over which the semiconductor substrate 100 is placed and a counter electrode (creating a state in which a bias voltage is applied). Oxygen cations are present in plasma and accelerated in a cathode direction (to the semiconductor substrate 100 side). By colliding with a surface of the oxide film 102 over the semiconductor substrate 100, the accelerated oxygen cations break Si—O bonds in a superficial portion of the oxide film 102, which leads to density decrease, and generate dangling bonds, which leads to surface activation.

In this embodiment mode, plasma treatment is performed using an oxygen gas by a method called a reactive ion etching (RIE) mode, which is a kind of capacitively coupled plasma. The semiconductor substrate 100 is placed on a stage over a cathode electrode to which a high-frequency voltage is applied through a capacitor, and a high-frequency voltage is applied to generate plasma. As a result, a negative self-bias is generated (a state in which a bias is applied is created), and cations in plasma are accelerated to collide with the semiconductor substrate 100. Note that a source gas is oxygen and the oxide film 102 formed over the semiconductor substrate 100 is silicon oxide; thus, etching action is weak.

Note that oxygen plasma treatment may be specifically performed under conditions with a treatment power of 0.1 W/cm$^2$ to 1.5 W/cm$^2$, a pressure of 30 Pa to 130 Pa, a gas (O$_2$) flow rate of 10 sccm to 200 sccm. In the case of using a nitrogen gas or an argon gas, plasma treatment can also be performed under similar conditions.

By oxygen plasma treatment, the average roughness (R$_a$) on the surface of the oxide film 102 is preferably made 0.7 nm or less, more preferably, 0.3 nm or less.

Figure 1B:
Figure 2A:
FIGS. 2A to 2C are diagrams illustrating an example of a method for manufacturing an SOI substrate.
Figure 2B:
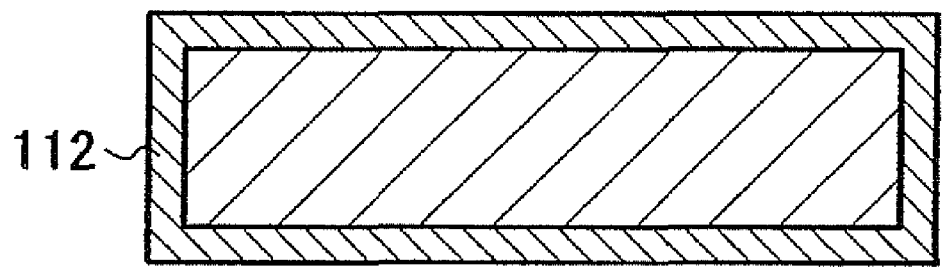
Figure 2C:
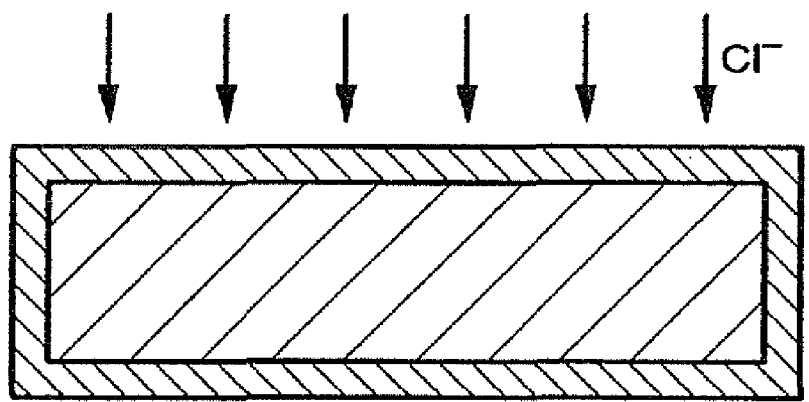

Next, a base substrate 120 is prepared (see FIG. 1B).

As the base substrate 120, a substrate made from an insulator is used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. In this embodiment mode, a case is described in which a glass substrate is used. When a glass substrate which can be manufactured in large sizes and is inexpensive is used as the base substrate 120, cost reduction can be achieved as compared to when a silicon wafer is used.

Before the base substrate 120 is used, it is preferable that a surface of the base substrate 120 be cleaned in advance. Specifically, the base substrate 120 is subjected to ultrasonic cleaning using a hydrochloric acid/hydrogen peroxide mixture (HPM), a sulfuric acid/hydrogen peroxide mixture (SPM), an ammonium hydroxide/hydrogen peroxide mixture (APM), dilute hydrofluoric acid (DHF), or the like. For example, it is preferable that a surface of the base substrate 120 be subjected to ultrasonic cleaning using a hydrochloric acid/hydrogen peroxide mixture. By such cleaning treatment, the surface of the base substrate 120 can be planarized and residual abrasive particles can be removed.

Figure 1C:
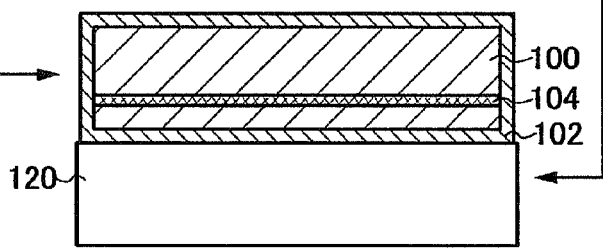

Next, the semiconductor substrate 100 and the base substrate 120 are disposed opposite to each other, and the surface of the oxide film 102 and the surface of the base substrate 120 are bonded to each other (see FIG. 1C)

Here, after the semiconductor substrate 100 and the base substrate 120 are disposed in contact with each other, a pressure of about 1 N/cm$^2$ to 500 N/cm$^2$, preferably, 1 N/cm$^2$ to 20 N/cm$^2$ is applied to a portion of an edge of the semiconductor substrate 100. From the portion where pressure is applied, the oxide film 102 and the base substrate 100 start to bond to each other and automatic bonding occurs and extends to the entire area. This bonding step is performed by the action of van der Waals force or hydrogen bonding and can be performed at room temperature without any heat treatment. Thus, a substrate having a low allowable temperature limit, such as a glass substrate, can be used as the base substrate 120.

Note that, before the semiconductor substrate 100 and the base substrate 120 are bonded to each other, the oxide film 102 formed over the semiconductor substrate 100 and the base substrate 120 are preferably subjected to surface treatment. As surface treatment, ozone treatment (such as cleaning with ozone water), megasonic cleaning, or both in combination can be performed. Alternatively, cleaning with ozone water and cleaning with hydrofluoric acid may be repeated plural times. By such surface treatment, dust such as organic substances on the surface of the oxide film 102 and the base substrate 120 can be removed and the surface can be made hydrophilic.

After the semiconductor substrate 100 is bonded to the base substrate 120, heat treatment is preferably performed in order to increase bonding strength between the base substrate 120 and the oxide film 102. This heat treatment is performed at a temperature where a crack is not generated in the embrittled region 104 and can be performed at a temperature equal to or higher than room temperature and lower than 400° C. By bonding the semiconductor substrate 100 to the base substrate 120 while heating at a temperature within the above range, bonding strength at the bonding interface between the base substrate 120 and the oxide film 102 can be made strong. The heat treatment can be performed using a diffusion furnace, a heating furnace such as a resistance heating furnace, a rapid thermal annealing (RTA) apparatus, a microwave heating apparatus, or the like.

When heat treatment is performed at such a temperature, bonding strength can usually be increased to some extent; however, sufficient bonding strength is hard to obtain. This is because, when heat treatment is performed after the semiconductor substrate and the base substrate are bonded to each other, bond is strengthened by occurrence of a dehydration condensation reaction and formation of covalent bonds at the bonding interface, but in order to promote the dehydration condensation reaction, moisture generated at the bonding interface through the dehydration condensation reaction needs to be removed by heat treatment at high temperature. In other words, when heat treatment after bonding is performed at high temperature, moisture generated at the bonding interface through a dehydration condensation reaction can be removed and bonding strength can be increased. On the other hand, when heat treatment is performed at low temperature, moisture generated at the bonding interface through a dehydration condensation reaction cannot be removed effectively;

thus, the dehydration condensation reaction does not progress and bonding strength cannot be improved sufficiently.

However, in this embodiment mode, the oxide film 102 is made to contain chlorine atoms as described above, whereby the oxide film 102 can absorb and effectively diffuse moisture. Accordingly, even when heat treatment is performed at low temperature, moisture generated through the dehydration condensation reaction can be absorbed and diffused into the oxide film 102 and the dehydration condensation reaction can be promoted efficiently. Thus, even when heat treatment after bonding is performed at low temperature, bonding strength between the oxide film 102 over the semiconductor substrate 100 and the base substrate 120 can be increased sufficiently.

In addition, the surface of the oxide film 102 is activated with dangling bonds formed by irradiation with ions in forming the embrittled region 104 or by plasma treatment of the surface of the oxide film 102. Thus, even at low temperature, strong bonding can be obtained between the oxide film 102 and the base substrate 120.

Figure 1D:
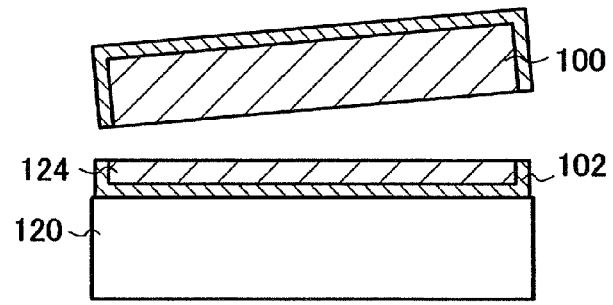

Next, heat treatment is performed to cause separation along the embrittled region 104, whereby a semiconductor film (here, a single crystal semiconductor film 124) is provided over the base substrate 120 with the oxide film 102 interposed therebetween (see FIG. 1D).

By heat treatment, due to temperature increase, the element added by ion doping is separated out into the microvoids which are formed in the embrittled region 104, and the pressure in the microvoids is increased. Due to pressure increase, a crack is generated in the embrittled region 104, whereby the semiconductor substrate 100 is divided along the embrittled region 104. Because the oxide film 102 is bonded to the base substrate 120, the single crystal semiconductor film 124 which is separated from the semiconductor substrate 100 is formed over the base substrate 120. This heat treatment is performed at a temperature not exceeding the strain point of the base substrate 120.

This heat treatment can be performed using a diffusion furnace, a heating furnace such as a resistance heating furnace, a rapid thermal annealing (RTA) apparatus, a microwave heating apparatus, or the like. For example, the heat treatment can be performed using an RTA apparatus at a heating temperature of 550° C. to 700° C. for 0.5 min to 60 min.

By such a plurality of times of heat treatment performed after the oxide film 102 over the semiconductor substrate 100 and the base substrate 120 are bonded to each other, bonding strength can be increased. Note that, by the heat treatment of FIG. 1D without the above-described heat treatment for increasing the bonding strength between the base substrate 120 and the oxide film 102, the heat treatment step for increasing the bonding strength between the base substrate 120 and the oxide film 102 and the heat treatment step for causing separation along the embrittled region 104 may be performed at the same time. Even when the steps are performed at the same time, by the inclusion of chlorine atoms in the oxide film 102, moisture generated at the bonding interface through a dehydration condensation reaction during heat treatment can be absorbed and diffused into the oxide film 102 and the dehydration condensation reaction can be promoted efficiently. As a result, the bonding strength between the oxide film 102 over the semiconductor substrate 100 and the base substrate 120 can be increased sufficiently.

Through the above steps, an SOI substrate in which the single crystal semiconductor film 124 is provided over the base substrate 120 with the oxide film 102 interposed therebetween can be manufactured. By employment of the manufacturing method described in this embodiment mode, a film formation step by a CVD method or a sputtering method becomes unnecessary for film formation. Thus, dust which is generated by film formation using a CVD method or a sputtering method can be prevented from being generated. As a result, defective bonding between a semiconductor substrate and a base substrate due to the influence of dust can be reduced.

HCl thermal oxidation of a semiconductor substrate is effective for shrinkage and annihilation of stacking faults formed in the semiconductor substrate. Thus, when a semiconductor substrate is used repeatedly (after being reprocessed) in a manufacturing process of an SOI substrate, stacking faults in the semiconductor substrate cause a problem. Such a problem can be solved by HCl thermal oxidation performed in a manufacturing process of an SOI substrate.

Note that a surface of the SOI substrate obtained through the above steps may be subjected to planarization treatment. By planarization treatment, the surface of the SOI substrate can be planarized even when unevenness is caused on the surface of the single crystal semiconductor film 124 over the base substrate 120 after separation.

The planarization treatment can be performed by chemical mechanical polishing (CMP), etching treatment, laser light irradiation, or the like. Here, the single crystal semiconductor film 124 is recrystallized and its surface is planarized by being irradiated with laser light after etching treatment (etch-back treatment) is performed by either dry etching or wet etching or by both in combination.

By irradiation with laser light from an upper surface side of the single crystal semiconductor film, the upper surface of the single crystal semiconductor film can be melted. After being melted, the single crystal semiconductor film is cooled and solidified, whereby a single crystal semiconductor film having an upper surface with higher planarity can be obtained. With use of laser light, the base substrate 120 is not directly heated; thus, increase in the temperature of the base substrate 120 can be suppressed. Accordingly, a substrate having low heat resistance, such as a glass substrate, can be used as the base substrate 120.

Note that it is preferable that the single crystal semiconductor film 124 be partially melted by laser light irradiation. This is because, if the single crystal semiconductor film 124 is completely melted, it is microcrystallized due to random nucleation after being changed into a liquid phase, so that crystallinity of the single crystal semiconductor film 124 is highly likely to decrease. On the other hand, by partial melting, crystal growth proceeds from a non-melted solid phase part. Accordingly, defects in the semiconductor film can be reduced. Note that "complete melting" herein means that the single crystal semiconductor film is melted into a liquid state down to the vicinity of its lower interface. On the other hand, "partial melting" means that the upper portion of the single crystal semiconductor film is melted into a liquid phase, but the lower portion is not melted and remains in a solid phase.

For the aforementioned laser light irradiation, a pulsed laser is preferably used. This is because a pulsed laser can instantaneously emit a pulsed laser beam with high energy, with which a partially melted state can easily be created. The repetition rate is preferably about 1 Hz to 10 MHz.

After the above-described laser light irradiation, a thinning step may be performed to reduce the thickness of the single crystal semiconductor film 124. The single crystal semiconductor film 124 may be thinned by etching treatment (etch-back treatment) by either dry etching or wet etching or by both in combination. For example, when the single crystal semiconductor film 124 is formed from a silicon material, the single crystal semiconductor film 124 can be thinned by dry etching using $SF_6$ and $O_2$ as a process gas.

Note that not only an SOI substrate but also the semiconductor substrate 100 after separation may be subjected to planarization treatment. By planarization of the surface of the semiconductor substrate 100 after separation, the semiconductor substrate 100 can be reused in a manufacturing process of an SOI substrate.

Note that the method for manufacturing an SOI substrate described in this embodiment mode can be appropriately combined with a manufacturing method in another embodiment mode of this specification.

Embodiment Mode 2

In this embodiment mode, a method for manufacturing an SOI substrate, which is different from that in the above embodiment mode, is described with reference to drawings. Specifically, a case is described in which an insulating film is formed over a surface of a base substrate.

First, an oxide film 102 is formed over a semiconductor substrate 100; an embrittled region 104 is formed by ion beam irradiation; then, a surface of the oxide film 102 is subjected to oxygen plasma treatment (see FIGS. 3A-1 to 3A-4). Note that, for a specific manufacturing process in FIGS. 3A-1 to 3A-4, the method illustrated in FIGS. 1A-1 to 1A-4 may be referred to; thus, detailed explanation thereof is omitted.

Figure 3A:
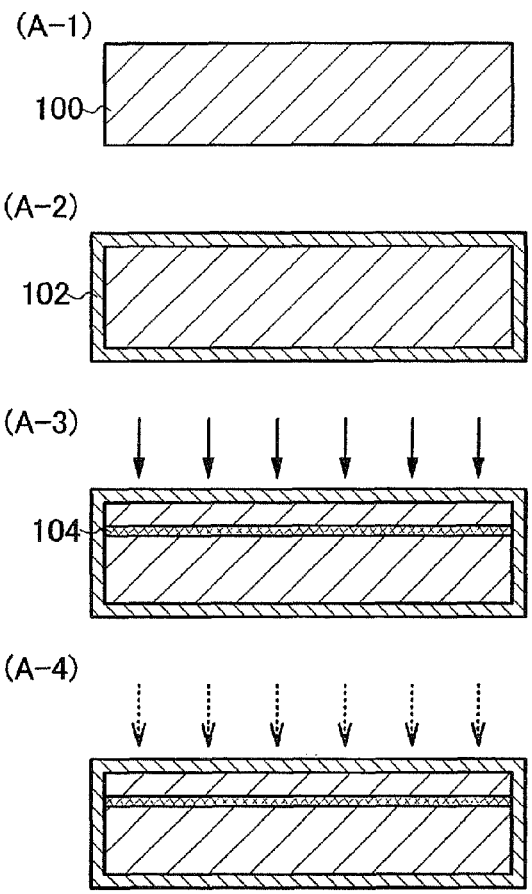
Figure 3B:
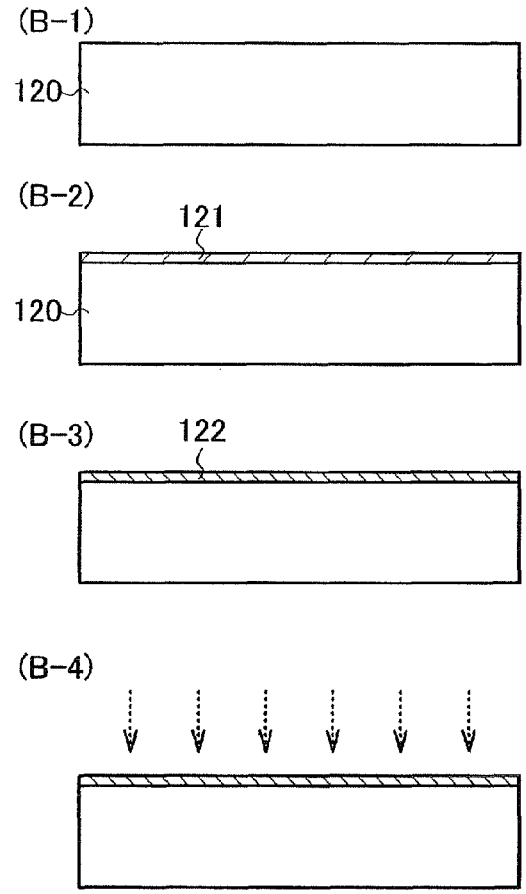

Next, a base substrate 120 is prepared (see FIG. 3B-1). Then, a semiconductor film 121 is formed over the base substrate 120 (see FIG. 3B-2) and subjected to thermal oxidation treatment in an oxidizing atmosphere containing dichloroethylene to form an oxide film 122 containing chlorine atoms over its surface (see FIG. 3B-3).

For example, a glass substrate having a strain point of 730° C. is used as the base substrate 120, and a semiconductor film is formed over the glass substrate. After that, thermal oxidation treatment is performed in an oxidizing atmosphere which contains trans-1,2-dichlorethylene (DCE) at a proportion of 1 vol. % to 5 vol. % (preferably, 2 vol. %) with respect to oxygen, at a temperature of 700° C. to 730° C. (typically, 720° C.), whereby the surface of the base substrate 120 is oxidized with chlorine. As a result, the oxide film 122 containing chlorine atoms is formed over the base substrate 120. The thickness of an oxide film to be formed is set to 10 nm to 1000 nm (preferably, 50 nm to 300 nm), for example, 100 nm. Trans-1,2-dichloroethylene is thermally decomposed at low temperature, which can be used when a substrate having a low allowable temperature limit (such as a glass substrate) is subjected to thermal oxidation treatment.

The semiconductor film 121 is formed to a thickness of 25 nm to 200 nm (preferably, 30 nm to 150 nm) by a sputtering method, an LPCVD method, a plasma CVD method, or the like. For example, an amorphous silicon film may be formed.

In other words, in this embodiment mode, a substrate provided with an oxide film obtained by chlorine oxidation and/or fluorine oxidation over its surface is used as the base substrate 120.

In addition, after the semiconductor film 121 (such as a silicon film) is formed over the base substrate 120, an oxide film 122 may be formed by chlorine oxidation and/or fluorine oxidation of the semiconductor film 121 by thermal oxidation treatment in an oxidizing atmosphere to which chlorine (Cl) and/or fluorine are/is added.

Note that, after the oxide film 122 is formed over the base substrate 120, a surface of the oxide film 122 is preferably subjected to plasma treatment (see FIG. 3B-4).

Plasma treatment of a surface to be treated is performed by introducing an inert gas (such as an argon (Ar) gas) and/or a reactive gas (such as an oxygen ($O_2$) gas or a nitrogen ($N_2$) gas) into a chamber in a vacuum state and applying a high-frequency voltage between an electrode over which a substrate is placed and a counter substrate (creating a state in which a bias voltage is applied). For example, oxygen plasma treatment of the oxide film 122 is performed by introducing an oxygen gas into a chamber in a vacuum state and applying a high-frequency voltage between an electrode over which the base substrate 120 is placed and a counter substrate (creating a state in which a bias voltage is applied). Oxygen cations are present in plasma and accelerated in a cathode direction (to the base substrate 120 side). By colliding with a surface of the base substrate 120, the accelerated oxygen cations break Si—O bonds in a superficial portion of the oxide film 122, which leads to density decrease, and generate dangling bonds, which leads to surface activation.

Figure 3C:
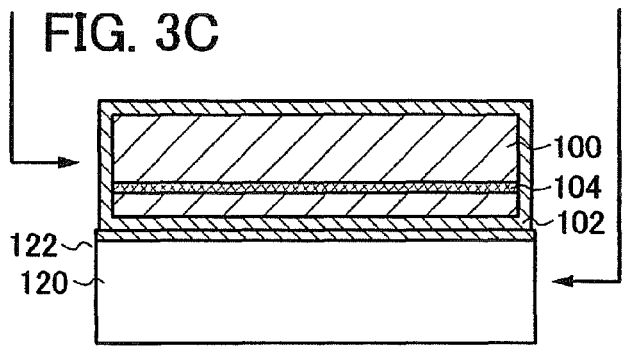
Figure 3D:
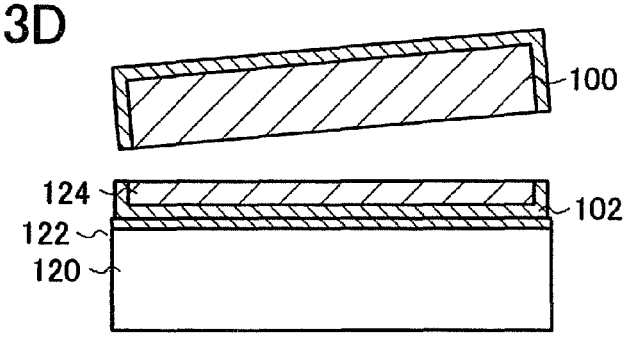

Next, the semiconductor substrate 100 and the base substrate 120 are disposed opposite to each other, and the surface of the oxide film 102 and the surface of the oxide film 122 are bonded to each other (see FIG. 3C). After that, by separation along the embrittled region 104 by heat treatment, a single crystal semiconductor film 124 is provided over the base substrate 120 with the oxide film 122 and the oxide film 102 interposed therebetween (see FIG. 3D).

In this embodiment mode, because the oxide film 102 and the oxide film 122 which serve as bonding planes are made to contain chlorine atoms, water molecules generated at the bonding interface by a dehydration condensation reaction can be diffused into the oxide film 102 and the oxide film 122 in heat treatment after bonding and the dehydration condensation reaction can be promoted efficiently. In addition, the surface of the oxide film 102 is activated with dangling bonds formed by irradiation with ions in forming the embrittled region 104 or by plasma treatment of the surface of the oxide film 102. Accordingly, bonding strength can be increased sufficiently even when heat treatment after bonding is performed at a temperature equal to or lower than the strain point of the glass substrate.

Note that, in this embodiment mode, the semiconductor substrate 100 is provided with an oxide film containing chlorine atoms as the oxide film 102; however, the present invention is not limited to this example. For example, an oxide film obtained by thermal oxidation treatment of the semiconductor substrate 100 in an oxidizing atmosphere may be used as the oxide film 102.

In addition, in this embodiment mode, a case is described in which the oxide film 122 containing chlorine atoms is formed by thermal oxidation treatment in an oxidizing atmosphere containing dichloroethylene after the semiconductor film 121 is formed over the base substrate 120; however, the present invention is not limited to this example. For example, chlorine atoms may be introduced into the vicinity of the surface of the base substrate 120 by addition of chlorine ions which are accelerated by an electric field with the use of an ion doping apparatus or an ion implantation apparatus. Furthermore, the surface of the base substrate 120 may be subjected to thermal oxidation treatment in an oxidizing atmosphere containing dichloroethylene.

Note that the method for manufacturing an SOI substrate described in this embodiment mode can be appropriately combined with a manufacturing method in another embodiment mode of this specification.

Embodiment Mode 3

In this embodiment mode, a method for manufacturing a semiconductor device using the SOI substrate manufactured in either one of the above-described embodiment modes is described.

First, a method for manufacturing an n-channel thin film transistor and a p-channel thin film transistor is described with reference to FIGS. 4A to 4D and FIGS. 5A to 5C. By combining a plurality of thin film transistors (TFTs), various types of semiconductor devices can be formed.

A case is described in which the SOI substrate manufactured by the method in Embodiment Mode 1 is used as an SOI substrate. It is needless to say that the SOI substrate manufactured by the method in Embodiment Mode 2 can also be used.

Figure 4A:
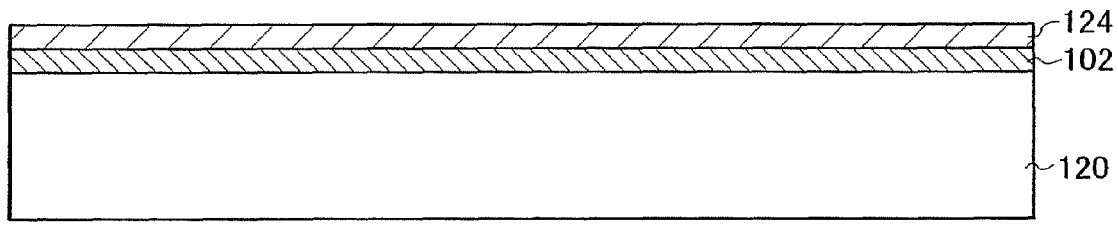
FIGS. 4A to 4D are diagrams illustrating an example of a method for manufacturing an SOI substrate.

FIG. 4A is a cross-sectional view of the SOI substrate manufactured by the method described with reference to FIGS. 1A-1 to 1A-4, 1B, 1C, and 1D.

Figure 4B:
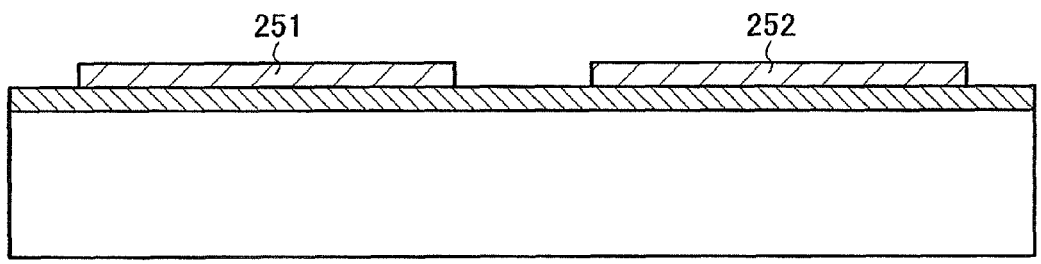

By element isolation of the single crystal semiconductor film 124 by etching, semiconductor films 251 and 252 are formed as illustrated in FIG. 4B. The semiconductor film 251 is used for forming an n-channel TFT, and the semiconductor film 252 is used for forming a p-channel TFT.

Figure 4C:
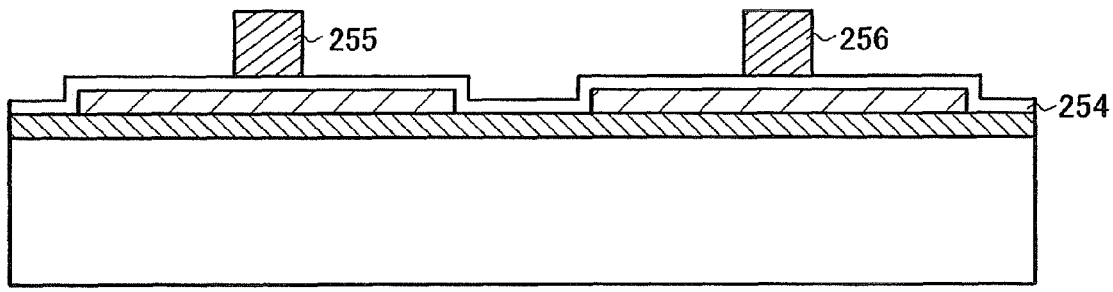

As illustrated in FIG. 4C, an insulating film 254 is formed over the semiconductor films 251 and 252. Next, gate electrodes 255 and 256 are formed over the semiconductor films 251 and 252 respectively with the insulating film 254 interposed therebetween.

Note that, before the single crystal semiconductor film 124 is etched, it is preferable to add an impurity element such as boron, aluminum, or gallium or an impurity element such as phosphorus or arsenic to the single crystal semiconductor film 124 in order to control the threshold voltage of TFTs. For example, an impurity element is added to a region where an n-channel TFT is to be formed, and an impurity element is added to a region where a p-channel TFT is to be formed.

Figure 4D:
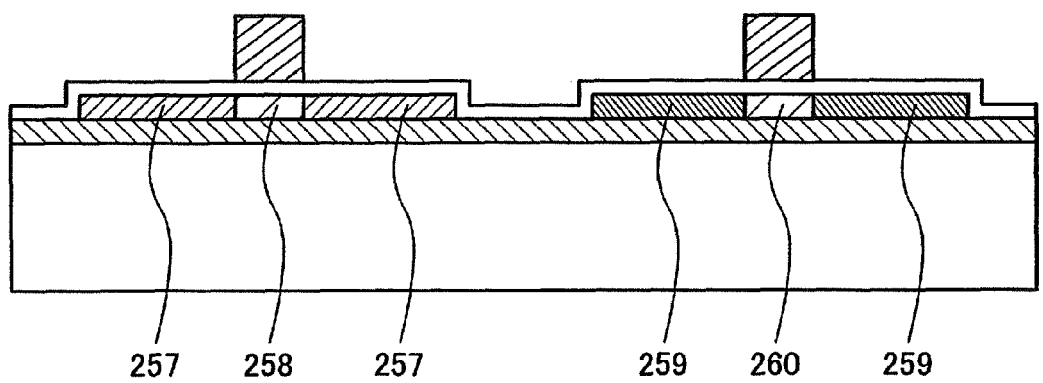

Next, as illustrated in FIG. 4D, n-type low-concentration impurity regions 257 are formed in the semiconductor film 251, and p-type high-concentration impurity regions 259 are formed in the semiconductor film 252. Specifically, first, the n-type low-concentration impurity regions 257 are formed in the semiconductor film 251. In order to form the n-type low-concentration impurity regions 257, the semiconductor film 252 where a p-channel TFT is to be formed is covered with a resist mask, and an impurity element is added to the semiconductor film 251. As the impurity element, phosphorus or arsenic may be added. When the impurity element is added by an ion doping method or an ion implantation method, the gate electrode 255 serves as a mask, and the n-type low-concentration impurity regions 257 are formed in the semiconductor film 251 in a self-aligned manner. A region of the semiconductor film 251 that overlaps the gate electrode 255 serves as a channel formation region 258.

Next, after the resist mask which covers the semiconductor film 252 is removed, the semiconductor film 251 where an n-channel TFT is to be formed is covered with a resist mask. Then, an impurity element is added to the semiconductor film 252 by an ion doping method or an ion implantation method. As the impurity element, boron can be added. In the step of adding the impurity element, the gate electrode 256 serves as a mask, and the p-type high-concentration impurity regions 259 are formed in the semiconductor film 252 in a self-aligned manner. The high-concentration impurity regions 259 function as a source region and a drain region. A region of the semiconductor film 252 that overlaps the gate electrode 256 serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 5A:
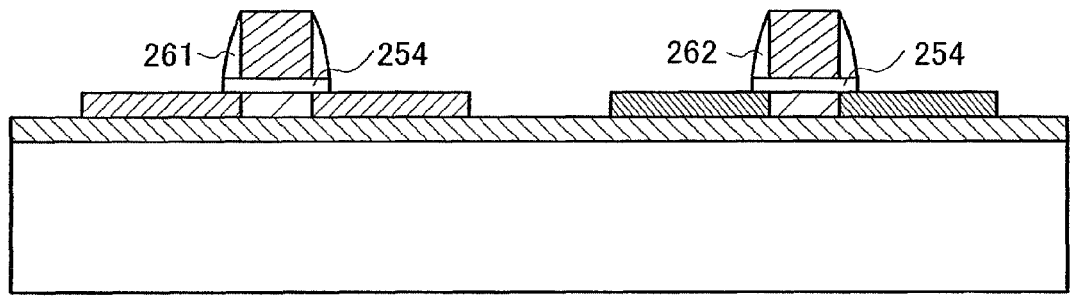
FIGS. 5A to 5C are diagrams illustrating an example of a method for manufacturing an SOI substrate.

Next, after the resist mask that covers the semiconductor film 251 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 261 and 262 are formed in contact with side surfaces of the gate electrodes 255 and 256 respectively, as illustrated in FIG. 5A. By this anisotropic etching, the insulating film 254 is also etched.

Figure 5B:
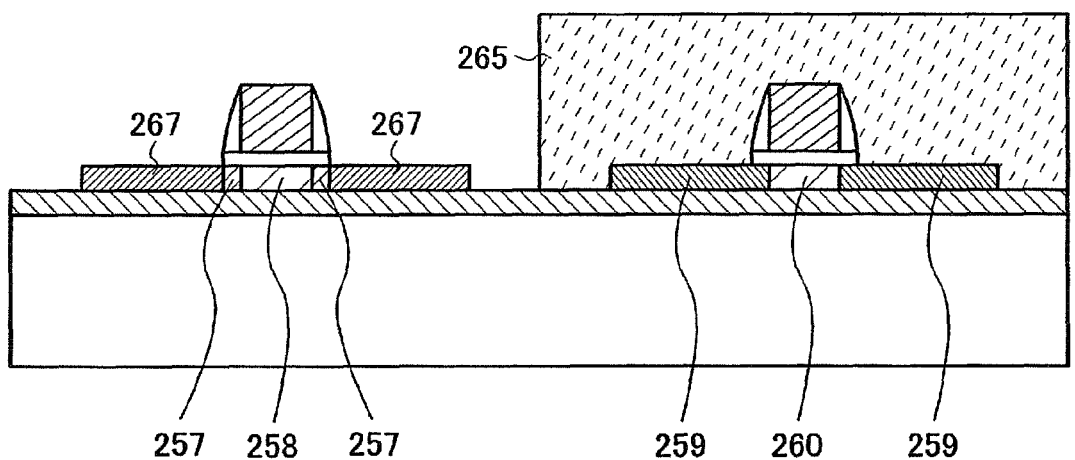

Next, as illustrated in FIG. 5B, the semiconductor film 252 is covered with a resist 265. In order to form high-concentration impurity regions functioning as a source region and a drain region in the semiconductor film 251, an impurity element is added to the semiconductor film 251 at high dose by an ion implantation method or an ion doping method. The gate electrode 255 and the sidewall insulating film 261 function as a mask, and n-type high-concentration impurity regions 267 are formed. Next, heat treatment for activating the impurity elements is performed.

Figure 5C:
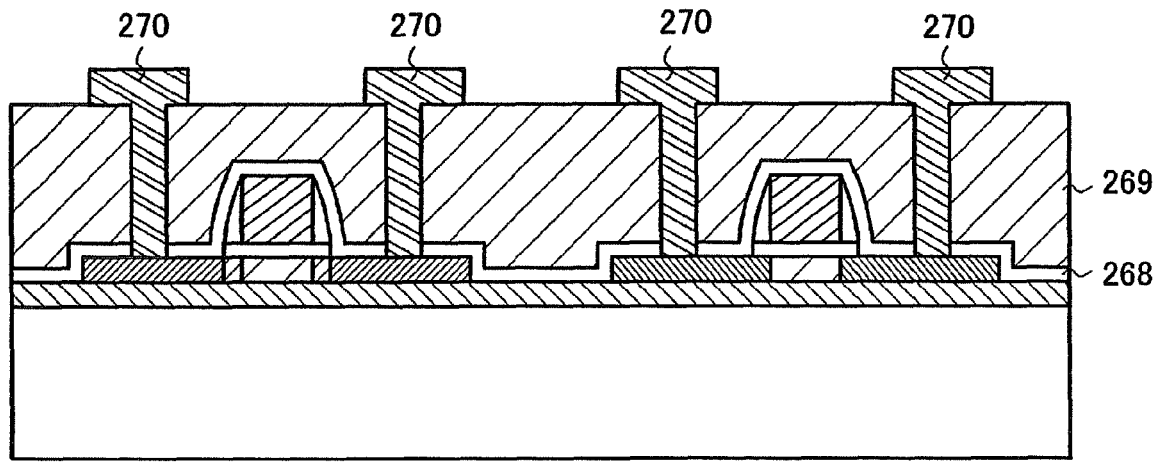

After the heat treatment for activation, an insulating film 268 containing hydrogen is formed as illustrated in FIG. 5C. After the insulating film 268 is formed, heat treatment is performed at a temperature of 350° C. to 450° C. so that hydrogen contained in the insulating film 268 diffuses into the semiconductor films 251 and 252. The insulating film 268 can be formed by deposition of silicon nitride or silicon nitride oxide by a plasma CVD method at a process temperature of 350° C. or lower. By supply of hydrogen to the semiconductor films 251 and 252, defects to serve as trapping centers in the semiconductor films 251 and 252 and at the interface with the insulating film 254 can be repaired effectively.

After that, an interlayer insulating film 269 is formed. The interlayer insulating film 269 can be formed with a film having a single layer structure or a stacked layer structure selected from insulating films of inorganic materials, such as a silicon oxide film and a borophosphosilicate glass (BPSG) film, and organic resin films of polyimide, acrylic, and the like. Contact holes are formed in the interlayer insulating film 269, and wirings 270 are then formed as illustrated in FIG. 5C. The wirings 270 can be formed with a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the steps described above, a semiconductor device having the n-channel TFT and the p-channel TFT can be manufactured. Because the metal element concentration of the semiconductor film in which the channel formation region is formed is reduced in the manufacturing process of the SOI substrate, a TFT with small off current and suppressed threshold voltage variation can be manufactured.

Although the method for manufacturing TFTs is described with reference to FIGS. 4A to 4D and FIGS. 5A to 5C, a semiconductor device with high added value can be manufactured by forming a variety of semiconductor elements such as a capacitor or a resistor as well as a TFT. Hereinafter, specific modes of semiconductor devices will be described with reference to drawings.

Figure 6:
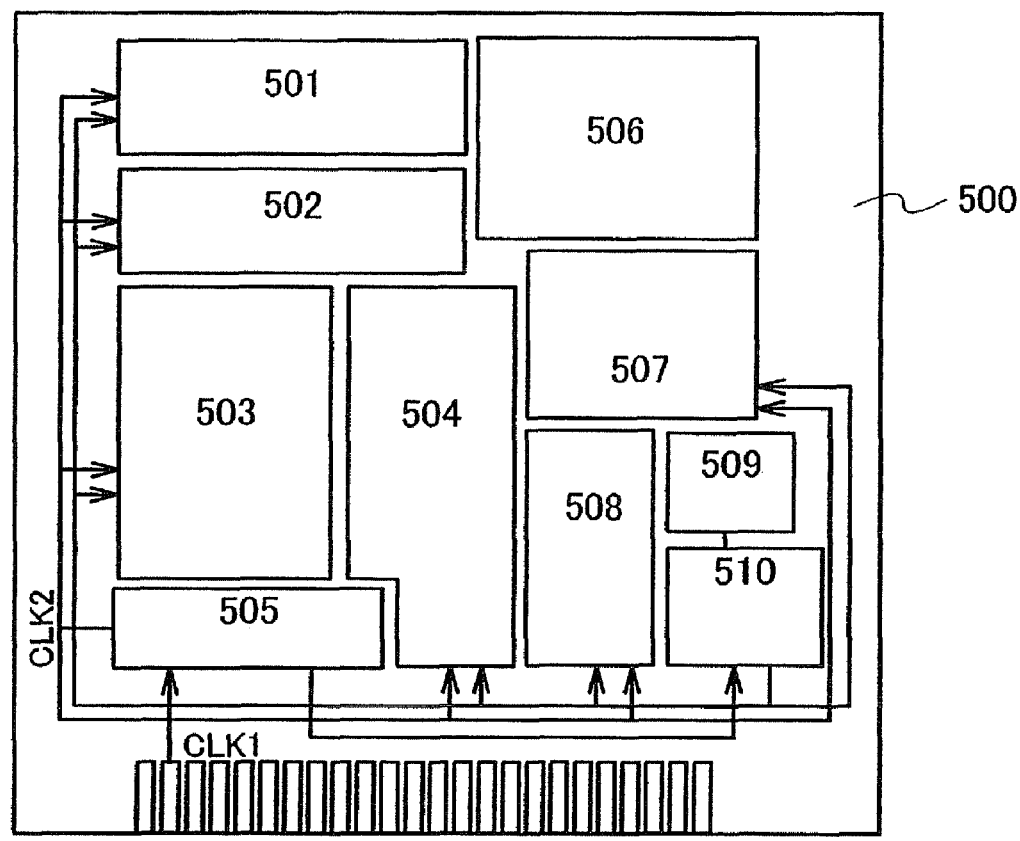
FIG. 6 is a diagram illustrating an example of a semiconductor device using an SOI substrate.

First, a microprocessor is described as an example of semiconductor devices. FIG. 6 is a block diagram illustrating an example of a structure of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
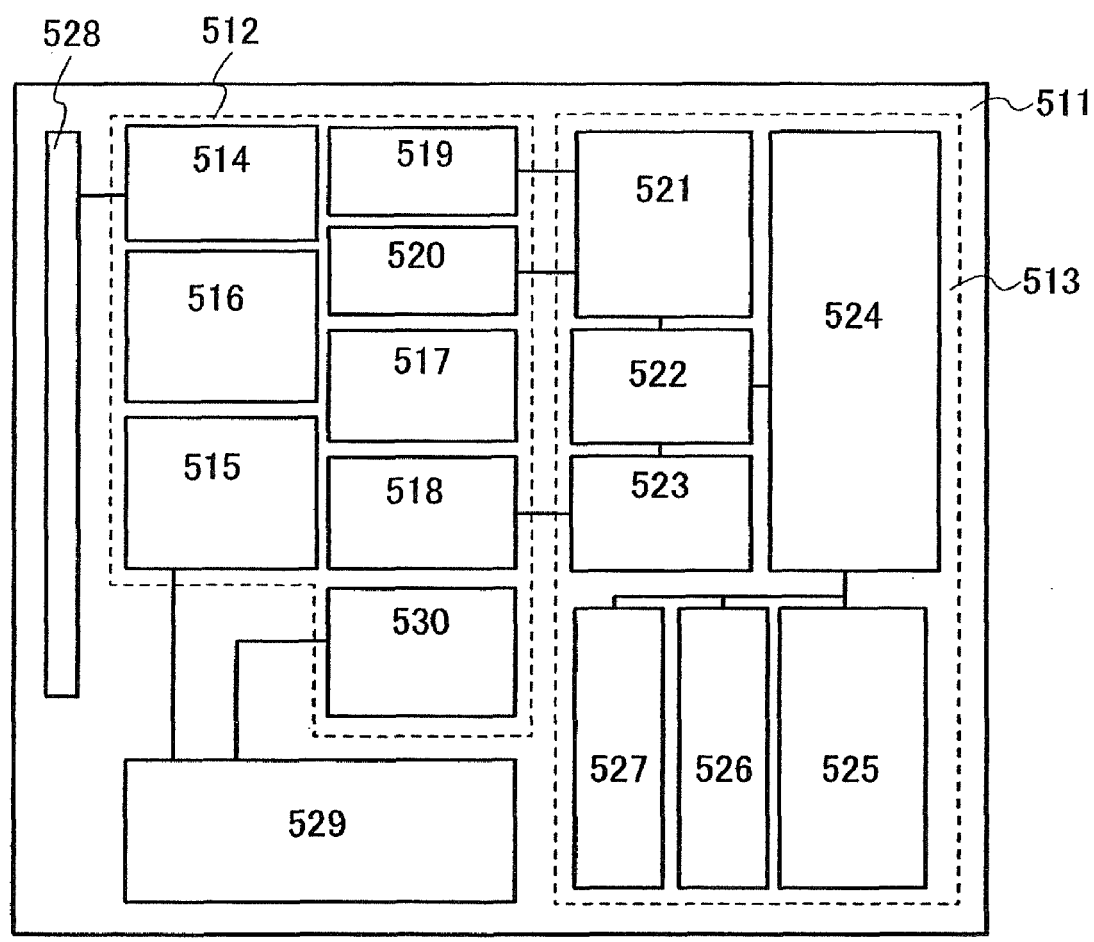
FIG. 7 is a diagram illustrating an example of a semiconductor device using an SOI substrate.

Next, an example of a semiconductor device having an arithmetic function and a contactless data transmission and reception function is described. FIG. 7 is a block diagram illustrating an example of a structure of such a semiconductor device. A semiconductor device illustrated in FIG. 7 can be called a computer that operates to transmit and receive signals to and from an external device by wireless communication (such a computer is hereinafter referred to as an "RFCPU").

As illustrated in FIG. 7, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, a CPU interface 524, a central processing unit 525, a random-access memory 526, and a read-only memory 527.

The operation of the RFCPU 511 is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 does not need to be formed over a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed with a low-pass filter and binarizes a received amplitude-modulated (ASK) signal based on its amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or a consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described with reference to FIGS. 8A and 8B and FIGS. 9A and 9B.

Figure 8A:
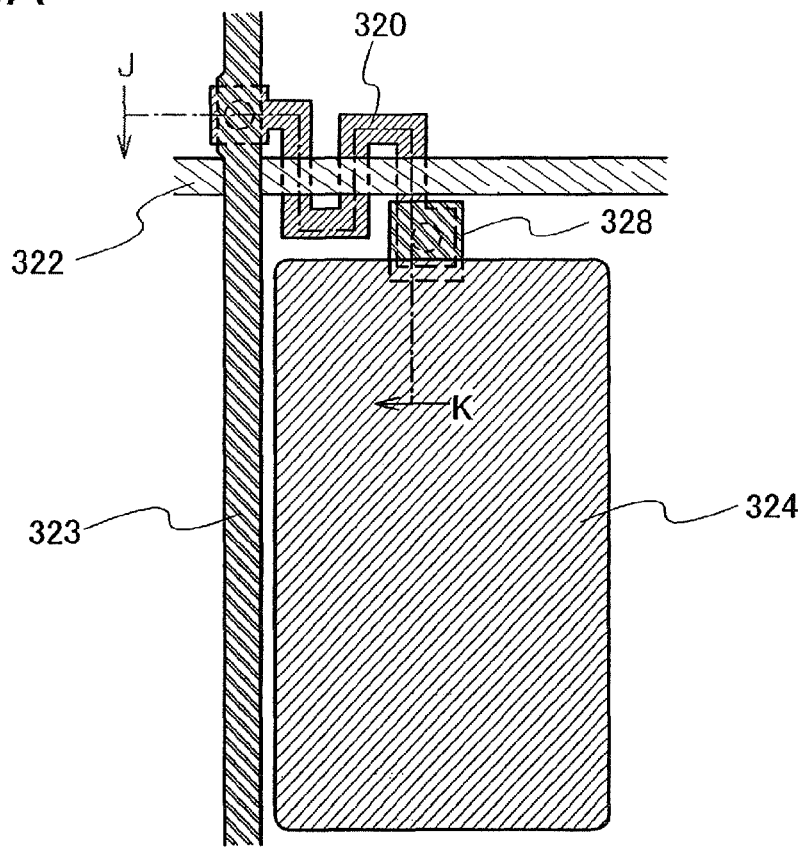
FIGS. 8A and 8B are diagrams illustrating an example of a display device using an SOI substrate.
Figure 8B:
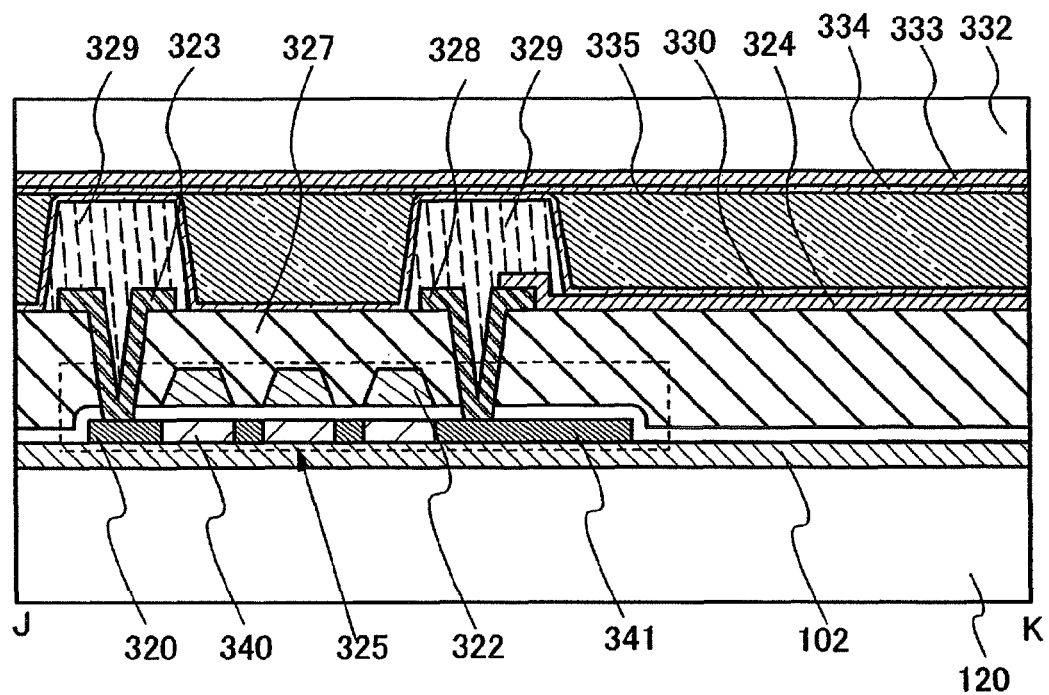

FIGS. 8A and 8B are drawings for describing a liquid crystal display device. FIG. 8A is a plan view of a pixel of the liquid crystal display device, and FIG. 8B is a cross-sectional view of FIG. 8A taken along a section line J-K.

As illustrated in FIG. 8A, the pixel includes a single crystal semiconductor film 320, a scan line 322 intersecting with the single crystal semiconductor film 320, a signal line 323 intersecting with the scan line 322, a pixel electrode 324, and an electrode 328 which electrically connects the pixel electrode 324 to the single crystal semiconductor film 320. The single crystal semiconductor film 320 is a layer formed of the single crystal semiconductor film provided over the base substrate 120 and is included in a TFT 325 of the pixel.

As an SOI substrate, the SOI substrate described in either one of Embodiment Modes 1 and 2 is used. As illustrated in FIG. 8B, the single crystal semiconductor film 320 is stacked over the base substrate 120 with the oxide film 102 interposed therebetween. As the base substrate 120, a glass substrate can be used. The single crystal semiconductor film 320 of the TFT 325 is formed by element isolation of the single crystal semiconductor film of the SOI substrate by etching. In the single crystal semiconductor film 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 120 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

Figure 9A:
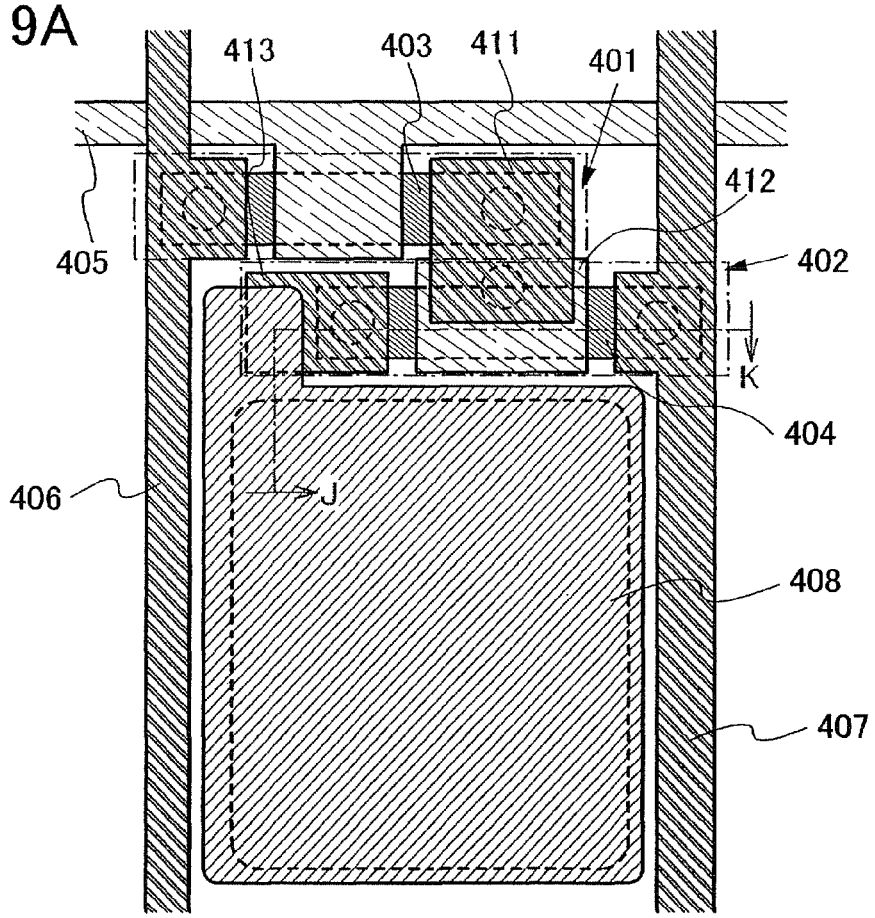
FIGS. 9A and 9B are diagrams illustrating an example of a display device using an SOI substrate.
Figure 9B:
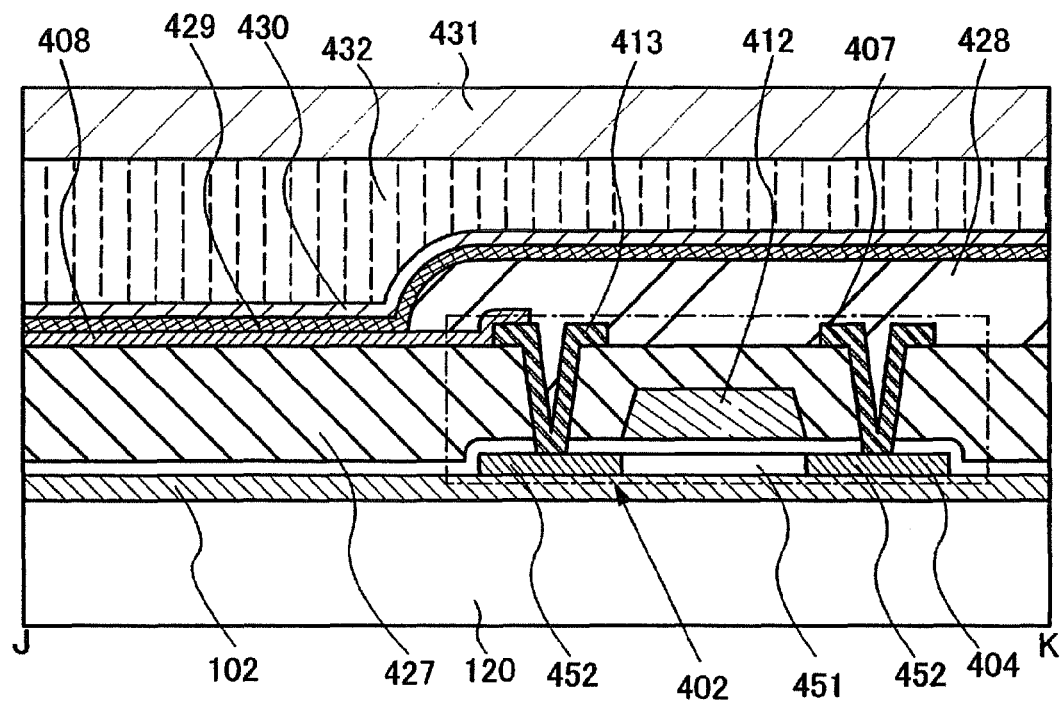

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view of FIG. 9A taken along a section line J-K.

As illustrated in FIG. 9A, the pixel includes a selecting transistor 401 and a display control transistor 402 that are TFTs, a scan line 405, a signal line 406, a current supply line 407, and a pixel electrode 408. Each pixel is provided with a light emitting element having a structure in which a layer containing an electroluminescent material (EL layer) is interposed between a pair of electrodes. One of the electrodes of the light emitting element is the pixel electrode 408. In a semiconductor film 403, a channel formation region, a source region, and a drain region of the selecting transistor 401 are formed. In a semiconductor film 404, a channel formation region, a source region, and a drain region of the display control transistor 402 are formed. The semiconductor films 403 and 404 are formed of the single crystal semiconductor film that is provided over the base substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other is included in the current supply line 407.

The display control transistor 402 is a p-channel TFT. As illustrated in FIG. 9B, in the semiconductor film 404, a channel formation region 451 and p-type high-concentration impurity regions 452 are formed. Note that, as the SOI substrate, the SOI substrate manufactured in either one of Embodiment Modes 1 and 2 is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429.

A counter substrate 431 is provided as a reinforcing plate, and the counter substrate 431 is fixed to the base substrate 120 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which largely vary from pixel to pixel. In order to employ the current drive method, a correction circuit which corrects characteristic variation is needed. When the EL display device is manufactured by a manufacturing method including a manufacturing process of an SOI substrate and a gettering step, the selecting transistor 401 and the display control transistor 402 do not have variation in electrical characteristics from pixel to pixel. Accordingly, the current drive method can be employed.

That is, various electronic devices can be manufactured by using SOI substrates. Examples of electronic devices include: cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices that are each capable of reproducing audio data stored in a recording medium such as a digital versatile disc (DVD) and that each have a display device capable of displaying image data stored therein); and the like. An example of them is illustrated in FIGS. 10A to 10C.

Figure 10A:
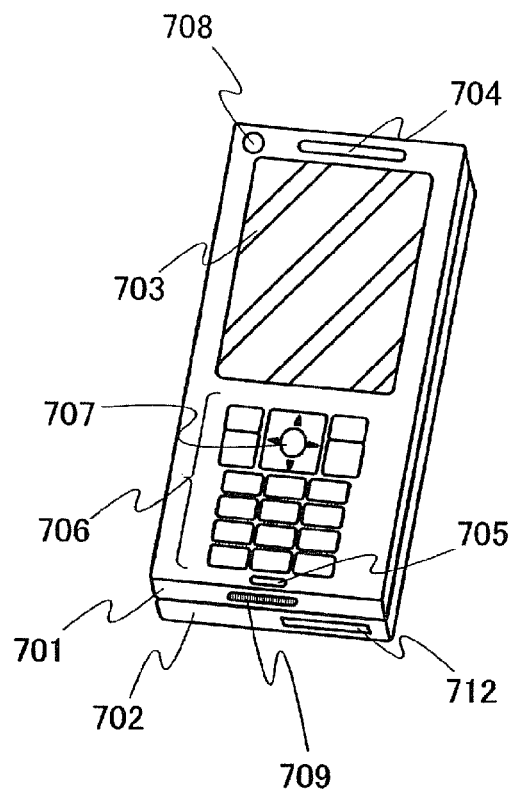
FIGS. 10A to 10C are diagrams illustrating an electronic device using an SOI substrate.
Figure 10B:
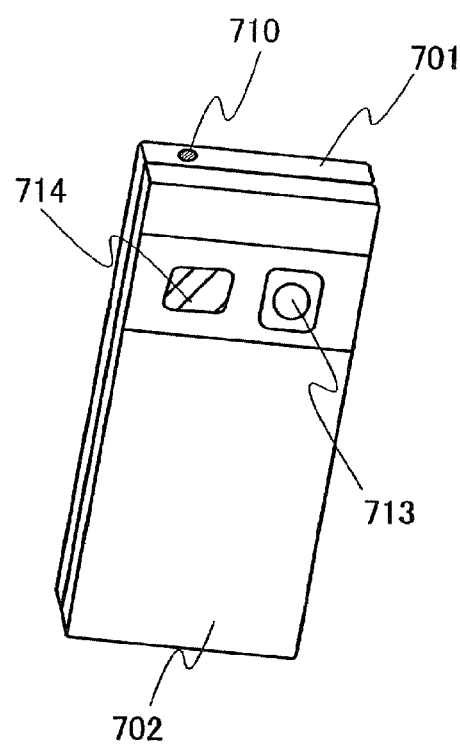
Figure 10C:
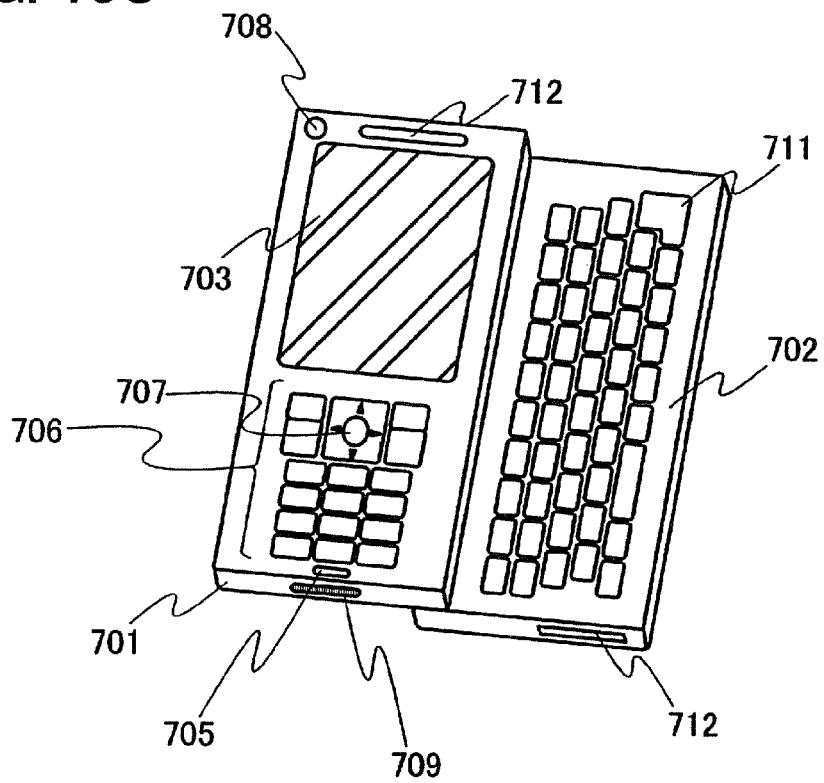

FIGS. 10A to 10C illustrate an example of a cellular phone using the aforementioned display device. FIG. 10A is a front view; FIG. 10B, a rear view; and FIG. 10C, a front view in which two housings are slid. A cellular phone illustrated in FIGS. 10A to 10C has two housings, a housing 701 and a housing 702. The cellular phone is a so-called smartphone that has both a function as a cellular phone and a function as a portable information terminal and incorporates a computer provided to conduct a variety of data processing besides voice calls.

The cellular phone illustrated in FIGS. 10A to 10C has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above components, the cellular phone illustrated in FIGS. 10A to 10C may incorporate a contactless IC chip, a small size memory device, or the like.

The housings 701 and 702 which are put together to be lapped with each other (illustrated in FIG. 10A) can be developed by sliding as illustrated in FIG. 10C. The display portion 703 can incorporate a display panel or a display device to which the method for manufacturing the display device described in Embodiment Mode 3 is applied. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone illustrated in FIGS. 10A to 10C can be used as a sound recording device (recorder) or a sound reproducing device. By operation with the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. The housings 701 and 702 which are put together to be lapped with each other (FIG. 10A) can be developed by sliding as illustrated in FIG. 10C. When the cellular phone is used as a portable information terminal, smooth cursor operation can be conducted using the keyboard 711 or the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The housing 702 is provided with the rear-face camera 713 and the light 714 on the rear face (FIG. 10B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

The electronic device illustrated in FIGS. 10A to 10C can be manufactured by application of the aforementioned method for manufacturing a transistor and a display device.

Embodiment 1

In this embodiment, the oxide film including chlorine that is described in either of the above embodiment modes is described.

First, a single crystal silicon substrate was prepared as a semiconductor substrate and subjected to heat treatment in an oxidizing atmosphere to which hydrogen chloride is added, whereby an oxide film (HCl thermal oxide $SiO_2$) was formed over the single crystal silicon substrate. Subsequently, the single crystal silicon substrate was irradiated with hydrogen ions through the oxide film by an ion doping method, whereby an embrittled region was formed at a predetermined depth from a surface of the single crystal semiconductor substrate. Then, a glass substrate was prepared as a base substrate and was bonded to the oxide film. Then, heat treatment was performed to cause separation along the embrittled region, whereby an SOI substrate was manufactured in which a single crystal silicon film was formed over the glass substrate with the oxide film interposed therebetween.

The heat treatment was performed in an oxidizing atmosphere which contained hydrogen chloride (HCl) at 3 vol. % with respect to oxygen at a temperature of 950° C. for 210 minutes. As a result, the oxide film with a thickness of 100 nm was formed. Further, the heat treatment after the bonding was performed using a heat treatment furnace at a heating temperature of 200° C. for 2 hours and then at 600° C. for 2 hours. The single crystal silicon film, which was obtained by the separation, had a thickness of 130 nm.

After that, chlorine contained in the oxide film was measured by secondary ion mass spectroscopy (SIMS).

Figure 11:
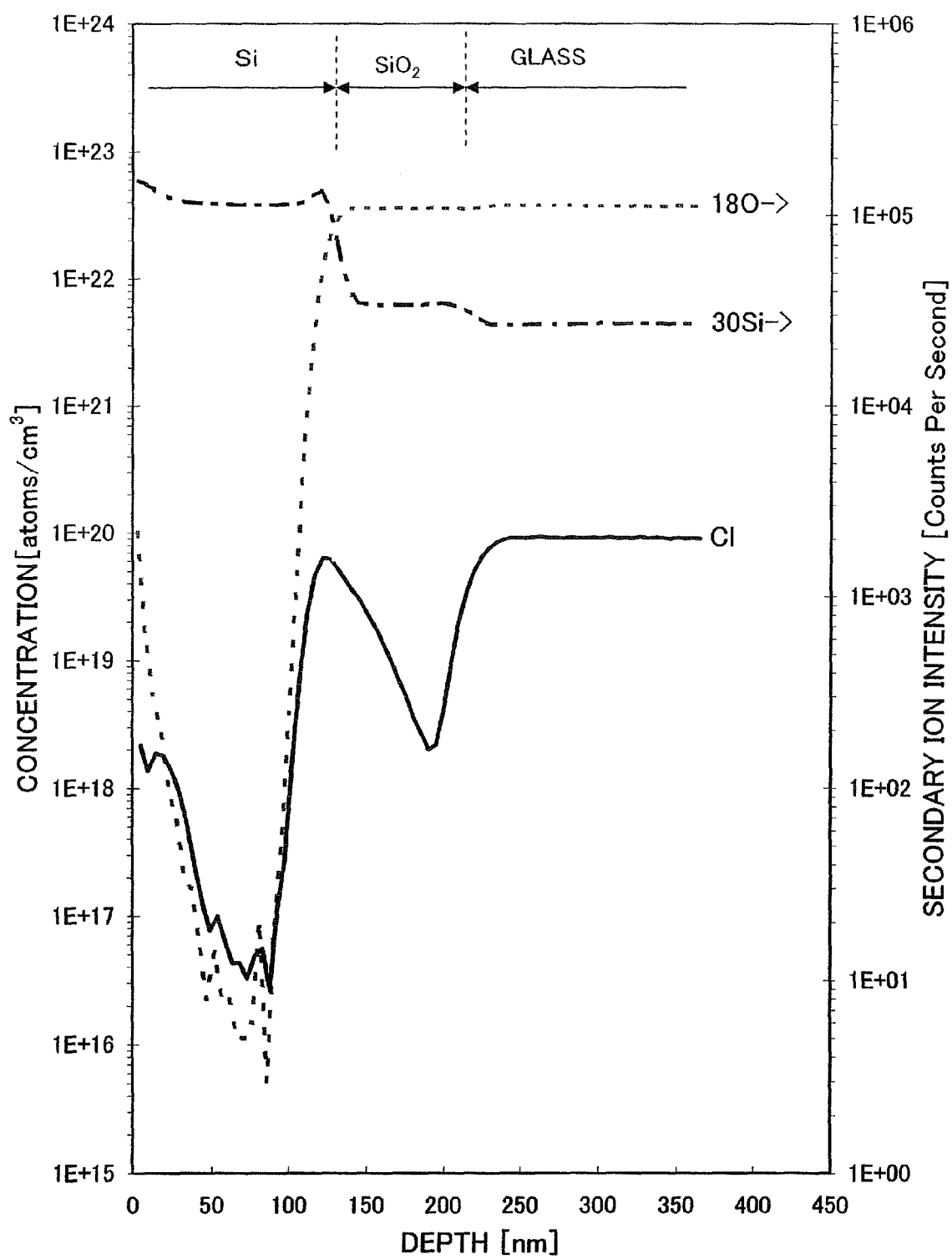
FIG. 11 is a diagram illustrating an oxide film containing chlorine atoms in an SOI substrate.

FIG. 11 illustrates a SIMS depth profile of a chlorine concentration in the oxide film formed over the glass substrate. In FIG. 11, the values of the chlorine concentration are valid only within the oxide film (HCl thermal oxidation $SiO_2$).

It can be confirmed from FIG. 11 that the chlorine concentration is low on the side closer to the interface between the oxide film and the glass substrate and is high on the side closer to the interface between the oxide film and the single crystal silicon film. In other words, when an SOI substrate is manufactured by thermal oxidation treatment of a single crystal silicon substrate in an oxidizing atmosphere containing hydrogen chloride and by bonding thereof to a glass substrate, an oxide film which contains a large amount of chlorine on the side closer to the interface between a single crystal silicon film and an insulating film can be formed.

Embodiment 2

In this embodiment, a change in surface characteristics when an oxide film formed over a single crystal semiconductor substrate is subjected to plasma treatment is described.

Samples evaluated in this embodiment are described. As Sample A, a single crystal silicon substrate was used as the single crystal semiconductor substrate, and a surface thereof was subjected to heat treatment in an oxidizing atmosphere to which hydrogen chloride was added, whereby an oxide film with a thickness of 100 nm was formed over the single crystal silicon substrate.

As Sample B, in a similar manner to Sample A, a single crystal silicon substrate was used and a surface thereof was subjected to heat treatment in an oxidizing atmosphere to which hydrogen chloride was added, whereby an oxide film with a thickness of 100 nm was formed over the single crystal silicon substrate. After that, the oxide film was irradiated with hydrogen ions. The conditions for the hydrogen ion irradiation were as follows: an RF discharge ion doping apparatus was used; the hydrogen gas flow rate was 30 sccm; the power output was 100 W; the acceleration voltage was 40 kV; and the dose was $2.0 \times 10^{16}$ ions/cm$^2$.

As Sample C, in a similar manner to Sample A, a single crystal silicon substrate was used and a surface thereof was subjected to heat treatment in an oxidizing atmosphere to which hydrogen chloride was added, whereby an oxide film with a thickness of 100 nm was formed over the single crystal silicon substrate. After that, the oxide film was irradiated with hydrogen ions. The conditions for the hydrogen ion irradiation were similar to those for Sample B. After that, a surface of the oxide film was subjected to plasma treatment. The conditions for the plasma treatment were as follows: an apparatus manufactured by Tegal Corporation (Model 981, a plasma dry etching apparatus) was used; a reactive ion etching (RIE) mode was employed; the electric power for the treatment was 200 W; the pressure was 66.7 Pa; the gas ($O_2$) flow rate was 100 sccm; and the treatment time was 30 seconds.

Figure 12:
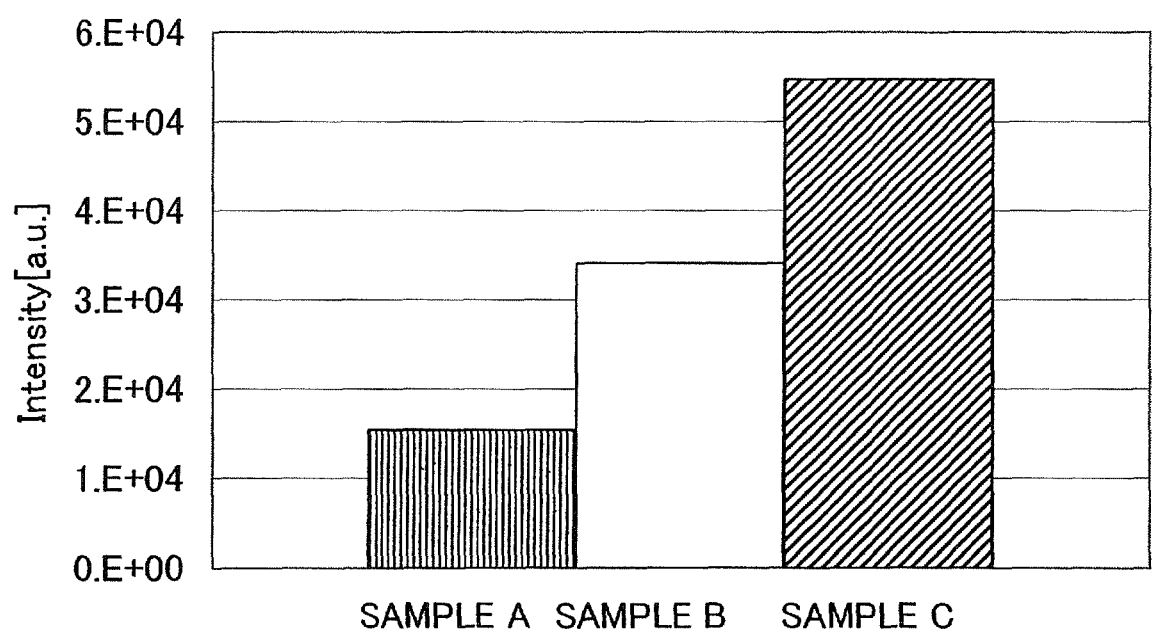
FIG. 12 is a diagram illustrating surface characteristics of oxide films formed over Si substrates.

Then, the surfaces of the oxide films of Samples A, B, and C underwent qualitative analysis by time-of-flight secondary ion mass spectrometry (ToF-SIMS). FIG. 12 illustrates analysis results of the surfaces of the oxide films of Samples A, B, and C. The horizontal axis shows Samples A, B, and C, and the vertical axis represents the intensity of $(SiO_2)_n$-OH-based negative ions.

It can be confirmed that the oxide film of Sample C, which has been subjected to the plasma treatment, has higher intensity of $(SiO_2)_n$-OH-based ions than Sample A or B, which has not been subjected to plasma treatment. That is, it can be confirmed that collision of accelerated oxygen cations with an oxide film reduces Si—H, Si—$H_2$, and $SiO_2$ and increases $(SiO_2)_n$-OH.

This application is based on Japanese Patent Application serial no. 2008-024520 filed with Japan Patent Office on Feb. 4, 2008, the entire contents of which are hereby incorporated by reference.

What is claimed is:

1. A method for manufacturing an SOI substrate, comprising:
    forming an oxide film containing a chlorine atom over a single crystal semiconductor substrate;
    irradiating the single crystal semiconductor substrate with an accelerated ion through the oxide film to form an embrittled region in a region at a predetermined depth from a surface of the single crystal semiconductor substrate;
    performing plasma treatment of the oxide film over the single crystal semiconductor substrate by applying a bias voltage;
    disposing the single crystal semiconductor substrate and a base substrate made from an insulator opposite to each other to bond a surface of the oxide film and a surface of the base substrate to each other; and
    performing heat treatment to cause separation along the embrittled region after bonding the surface of the oxide film and the surface of the base substrate to each other, thereby forming a single crystal semiconductor film over the base substrate with the oxide film interposed therebetween,
    wherein concentration of chlorine is higher in an interface between the oxide film and the single crystal semiconductor film than in an interface between the oxide film and the base substrate.

2. A method for manufacturing an SOI substrate according to claim 1, wherein the oxide film is formed by thermal oxidation treatment of the single crystal semiconductor substrate in an oxidizing atmosphere containing hydrogen chloride or trans-1,2-dichloroethylene.

3. A method for manufacturing an SOI substrate according to claim 1, wherein the plasma treatment is performed using an oxygen gas.

4. A method for manufacturing an SOI substrate according to claim 1, wherein the heat treatment is performed at a temperature equal to or lower than a strain point of the base substrate.

5. A method for manufacturing an SOI substrate according to claim 1, wherein a glass substrate is used as the base substrate.

6. A method for manufacturing an SOI substrate according to claim 1, wherein the oxide film comprises silicon oxide containing a chlorine atom.

7. A method for manufacturing an SOI substrate, comprising:
    forming a first oxide film containing a chlorine atom over a single crystal semiconductor substrate;
    forming a second oxide film containing a chlorine atom over a base substrate made from an insulator;
    irradiating the single crystal semiconductor substrate with an accelerated ion through the first oxide film to form an embrittled region in a region at a predetermined depth from a surface of the single crystal semiconductor substrate;
    performing plasma treatment of the first oxide film over the single crystal semiconductor substrate by applying a bias voltage;
    disposing the single crystal semiconductor substrate and the base substrate opposite to each other to bond a surface of the first oxide film and a surface of the second oxide film to each other; and
    performing heat treatment to cause separation along the embrittled region after bonding the surface of the first oxide film and the surface of the second oxide film to each other, thereby forming a single crystal semiconductor film over the base substrate with the second oxide film and the first oxide film interposed therebetween.

8. A method for manufacturing an SOI substrate according to claim 7, wherein the first oxide film is formed by thermal oxidation treatment of the single crystal semiconductor substrate in an oxidizing atmosphere containing hydrogen chloride or trans-1,2-dichloroethylene.

9. A method for manufacturing an SOI substrate according to claim 7, wherein the second oxide film is formed by:
    forming a semiconductor film over the base substrate; and
    oxidizing the semiconductor film by performing thermal oxidation treatment in an oxidizing atmosphere containing hydrogen chloride or trans-1, 2-dichloroethylene.

10. A method for manufacturing an SOI substrate according to claim 7, further comprising performing plasma treatment of the second oxide film over the base substrate by applying a bias voltage before bonding the surface of the first oxide film and the surface of the second oxide film to each other.

11. A method for manufacturing an SOI substrate according to claim 7, wherein the plasma treatment is performed using an oxygen gas.

12. A method for manufacturing an SOI substrate according to claim 7, wherein the heat treatment is performed at a temperature equal to or lower than a strain point of the base substrate.

13. A method for manufacturing an SOI substrate according to claim 7, wherein a glass substrate is used as the base substrate.

14. A method for manufacturing an SOI substrate according to claim 7, wherein the second oxide film is formed by:
    forming a semiconductor film over the base substrate; and
    oxidizing the semiconductor film by performing thermal oxidation treatment in an oxidizing atmosphere containing dichloroethylene.

15. A method for manufacturing an SOI substrate, comprising:
    forming an oxide film containing a chlorine atom over a single crystal semiconductor substrate;
    irradiating the single crystal semiconductor substrate with an accelerated hydrogen ion through the oxide film to form an embrittled region in a region at a predetermined depth from a surface of the single crystal semiconductor substrate;
    performing plasma treatment of the oxide film over the single crystal semiconductor substrate by applying a bias voltage;
    disposing the single crystal semiconductor substrate and a base substrate made from an insulator opposite to each other to bond a surface of the oxide film and a surface of the base substrate to each other; and
    performing heat treatment to cause separation along the embrittled region after bonding the surface of the oxide film and the surface of the base substrate to each other, thereby forming a single crystal semiconductor film over the base substrate with the oxide film interposed therebetween,
    wherein concentration of chlorine is higher in an interface between the oxide film and the single crystal semiconductor film than in an interface between the oxide film and the base substrate.

16. A method for manufacturing an SOI substrate according to claim 15, wherein the oxide film is formed by thermal oxidation treatment of the single crystal semiconductor substrate in an oxidizing atmosphere containing hydrogen chloride or trans-1,2-dichloroethylene.

17. A method for manufacturing an SOI substrate according to claim 15, wherein the plasma treatment is performed using an oxygen gas.

18. A method for manufacturing an SOI substrate according to claim 15, wherein the heat treatment is performed at a temperature equal to or lower than a strain point of the base substrate.

19. A method for manufacturing an SOI substrate according to claim 15, wherein a glass substrate is used as the base substrate.

20. A method for manufacturing an SOI substrate according to claim 15, wherein the oxide film comprises silicon oxide containing a chlorine atom.

* * * * *